US 7,755,179 B2

(12) United States Patent
Carney et al.

(10) Patent No.: US 7,755,179 B2
(45) Date of Patent: Jul. 13, 2010

(54) SEMICONDUCTOR PACKAGE STRUCTURE HAVING ENHANCED THERMAL DISSIPATION CHARACTERISTICS

(75) Inventors: Francis J. Carney, Gilbert, AZ (US);
Michael J. Seddon, Gilbert, AZ (US);
Kent L. Kime, Phoenix, AZ (US);
Dluong Ngan Leong, Negeri Sembilan (MY); Yeu Wen Lee, Negeri Sembilan (MY)

(73) Assignee: Semiconductor Components Industries, LLC, Phoenix, AZ (US)

( * ) Notice: Subject to any disclaimer, the term of this patent is extended or adjusted under 35 U.S.C. 154(b) by 440 days.

(21) Appl. No.: 11/575,864

(22) PCT Filed: Dec. 20, 2004

(86) PCT No.: PCT/US2004/043077
§ 371 (c)(1),
(2), (4) Date: Mar. 22, 2007

(87) PCT Pub. No.: WO2006/068643
PCT Pub. Date: Jun. 29, 2006

(65) Prior Publication Data
US 2008/0246130 A1    Oct. 9, 2008

(51) Int. Cl.
*H01L 23/02* (2006.01)
(52) U.S. Cl. .................. 257/686; 257/712; 257/E23.051
(58) Field of Classification Search .................. 257/707, 257/E23.051, 678, 684–690, 701–702, 706, 257/712–713, 717–719, 723–724, 728–730
See application file for complete search history.

(56) References Cited

U.S. PATENT DOCUMENTS

| | | | | |
|---|---|---|---|---|
| 4,358,552 A * | 11/1982 | Shinohara et al. | ............ | 523/443 |
| 5,098,609 A * | 3/1992 | Iruvanti et al. | ............... | 252/511 |
| 5,106,433 A * | 4/1992 | Nakamura et al. | .......... | 148/546 |
| 5,305,179 A * | 4/1994 | Sono et al. | ................... | 361/718 |
| 5,312,508 A * | 5/1994 | Chisholm | ................... | 156/292 |
| 5,459,352 A * | 10/1995 | Layton et al. | ................ | 257/724 |
| 5,896,269 A * | 4/1999 | Autry | ......................... | 361/704 |
| 6,172,415 B1 * | 1/2001 | Ishijima et al. | .............. | 257/707 |
| 6,262,475 B1 * | 7/2001 | Liu et al. | ..................... | 257/675 |
| 6,319,756 B2 * | 11/2001 | Duesman et al. | ............ | 438/122 |
| 6,677,669 B2 * | 1/2004 | Standing | ..................... | 257/685 |
| 2004/0217488 A1 * | 11/2004 | Luechinger | ................. | 257/784 |
| 2004/0232545 A1 * | 11/2004 | Takaishi | ..................... | 257/707 |
| 2005/0016714 A1 * | 1/2005 | Chung | ................... | 165/104.15 |
| 2005/0017350 A1 * | 1/2005 | Corti et al. | .................. | 257/706 |
| 2005/0093135 A1 * | 5/2005 | Liu et al. | ..................... | 257/707 |
| 2005/0180113 A1 * | 8/2005 | Shirakami et al. | ........... | 361/704 |
| 2006/0087015 A1 * | 4/2006 | Yuan et al. | .................. | 257/678 |
| 2007/0161157 A1 * | 7/2007 | Islam et al. | .................. | 438/120 |

* cited by examiner

*Primary Examiner*—Matthew C Landau
*Assistant Examiner*—Daren Wolverton
(74) *Attorney, Agent, or Firm*—Kevin B. Jackson

(57) ABSTRACT

In an exemplary embodiment, a packaged device having enhanced thermal dissipation characteristics includes a semiconductor chip having a major current carrying or heat generating electrode. The semiconductor chip is oriented so that the major current carrying electrode faces the top of the package or away from the next level of assembly. The packaged device further includes a conductive clip for coupling the major current carrying electrode to a next level of assembly, and a heat spreader device formed on or integral with the conductive clip. A portion of the heat spreader device may be optionally exposed.

5 Claims, 4 Drawing Sheets ent invention;

SEMICONDUCTOR PACKAGE STRUCTURE HAVING ENHANCED THERMAL DISSIPATION CHARACTERISTICS

BACKGROUND OF THE INVENTION

The present invention relates in general to semiconductor device packaging and, more particularly, to semiconductor components housed in packages having improved heat transfer characteristics.

There is a continuing demand for electronic systems with a higher functionality and smaller physical size. With this demand, there are several challenges that face electronic component designers and manufacturers. Such challenges include the management of heat generated by power semiconductor devices, which are typically arranged closely together or next to sensitive logic circuits on electronic circuit boards.

In current configurations, plastic encapsulated devices are commonly used. One problem with plastic packages is that the thermal conductivity out of a package is often limited by the plastic molding material. As a result, the majority of the heat generated by the semiconductor device is transferred through the lower part of the package next to the printed circuit board. Because the printed circuit boards are becoming more densely populated, the boards cannot properly dissipate or handle large amounts of heat. When this happens, the boards can warp, which can cause damage to both the board and the components on the board. In addition, the heat itself can damage other components on the printed circuit board or the materials that make up the board.

In view of this problem, the semiconductor industry is migrating to packages that have the capability of transferring heat out through the top of the package instead of through the printed circuit boards. However, current designs have several disadvantages including exposed or non-passivated semiconductor devices and non-standard manufacturing techniques. These disadvantages affect reliability and increase manufacturing costs and cycle time. Additionally, such designs typically place the device in major current carrying electrode down orientation (e.g., "source-down") so that heat continues to be transferred through the printed circuit boards, which is an inefficient mode of heat transfer.

Accordingly, a need exists for semiconductor packages that have enhanced thermal dissipation characteristics without detrimentally impacting device reliability, manufacturing cycle time, and cost.

DETAILED DESCRIPTION OF THE DRAWINGS

Figure 1:
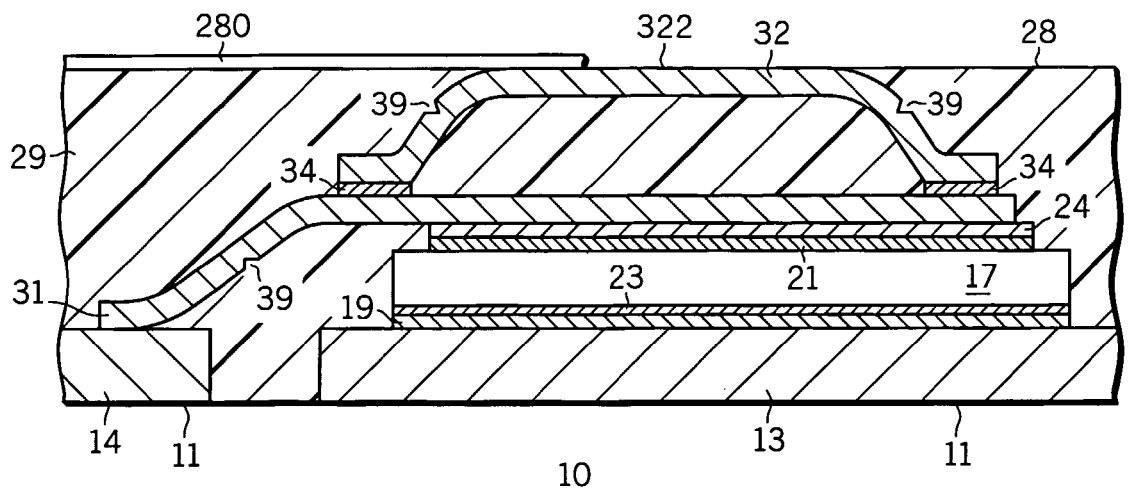
FIG. 1 illustrates an enlarged cross-sectional view of a package structure according to an embodiment of the present invention.

For ease of understanding, elements in the drawing figures are not necessarily drawn to scale, and like element numbers are used where appropriate throughout the various figures. Although the invention is described using a leadless package embodiments, those skilled in the art will recognize that the present invention is applicable to other types of packages as well, particularly those where enhanced heat transfer characteristics are important.

FIG. 1 shows an enlarged cross-sectional view of a packaged semiconductor structure, leadless package, leadless packaged device or package 10 having enhanced thermal dissipation or heat transfer characteristics in accordance with the present invention. Packaged device 10 includes a conductive substrate or lead frame 11, which includes a flag, plate, or die attach portion 13 and a lead, terminal, connection, or pad portion 14. Lead frame 11 comprises, for example, copper, a copper alloy (e.g., TOMAC 4, TAMAC 5, 2ZFROFC, or CDA194), a copper plated iron/nickel alloy (e.g., copper plated Alloy 42), plated aluminum, plated plastic, or the like. Plated materials include copper, silver, multi-layer plating such nickel-palladium and gold. Flag portion 13 and pad portion 14 are used to connect or couple to bonding pads on a next level of assembly such as a printed circuit board.

Package 10 further includes an electronic chip or semiconductor device 17, which is attached to flag 13 using a die attach layer 19. Semiconductor device 17 comprises, for example, a power MOSFET device, a bipolar transistor, an insulated gate bipolar transistor, a thyristor, a diode, an analog or digital integrated circuit, a sensor, a passive component, or other electronic device. In an exemplary embodiment, semiconductor device 17 comprises a power MOSFET device including a source, an up-source, or major current carrying electrode or terminal 21, a drain, down-drain, or current carrying electrode or terminal 23, and a gate or control electrode (not shown). Source electrode 21 comprises, for example, a solderable top metal, aluminum, an aluminum alloy, or the like. Drain electrode 23 typically comprises a solderable metal layer or layers such as TiNiAg, CrNiAu, or the like. In accordance with the present invention, semiconductor chip 17 is in a major current carrying electrode or source electrode "up" or up-source configuration. That is, the major heat generating electrode (e.g., electrode 21) of semiconductor chip 17 is oriented away from or opposite from the side of package 10 that will be attached to the next level assembly. This orientation promotes heat transfer out of top surface 28 of package 10, instead of through the next level of assembly or through the chip itself.

A conductive attachment structure or conductive clip or strap 31 is coupled to source electrodes 21 and pad portion 14 to provide an electrical path between semiconductor chip 17 and pad portion 14. Conductive clip 31 is attached to electrodes 21 using, for example, an attachment layer 24. Suitable materials for attachment layer 24 include solder, or high conductivity epoxy materials, such as a CEL9750 HFLO (AL3) or a CEL9210 HFLO(AL2) epoxy available from Hitachi Chemical, or an EMF 760a epoxy available from Sumitomo Plastics America. Similar materials are used, for example, to further attach conductive clip 31 to pad portion 14.

A heat spreader device, a thermal dissipation structure or thermally conductive device or clip or strap 32 is integrated, formed with, attached, or coupled (directly or indirectly) to conductive clip 31. In an exemplary embodiment, heat spreader 32 is attached to conductive clip 31 using an attachment layer 34. In an exemplary embodiment, heat spreader 32 comprises a bridge-like shape. Clip 31 and heat spreader device 32 comprise, for example, rigid copper or a copper alloy and may be optionally plated with silver for either solder attachment or conductive epoxy attachment. Alternatively, heat spreader device 32 comprises a flexible or compliant material as described below. Suitable materials for attachment layer 34 include solder, or high conductivity epoxy materials, such as a CEL9750 HFLO(AL3) or a CEL9210 HFLO(AL2) epoxy available from Hitachi Chemical, or an EMF 760a epoxy available from Sumitomo Plastics America. Clip 31 is attached to pad portion 14 using a solder, conductive epoxy, or the like.

In accordance with the present invention, clip 31 is designed to have a maximum surface area to attach to electrode 21, which reduces the electrical resistance of package 10. Integrated heat spreader structure 32 is used, among other things, to enhance the transfer of heat that major current carrying electrode 21 generates out the top of package 10. This lowers thermal resistance and improves the overall performance and reliability of package 10.

Figure 9:
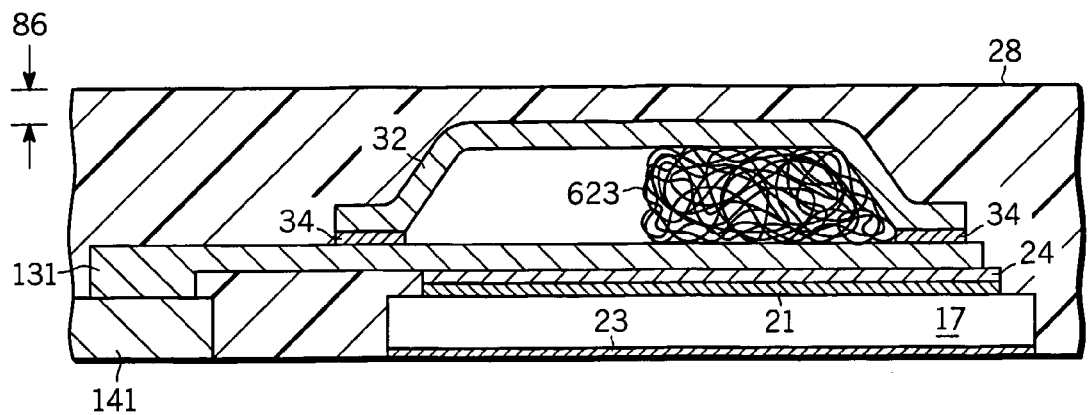
FIG. 9 illustrates an enlarged cross-sectional view of a package structure according to a fourth embodiment of the present invention.

An encapsulating or passivating layer 29 is formed over lead frame 11, at least a portion of semiconductor chip 17, at least a portion of attachment structure 31, and at least a portion of heat spreader structure 32 using a single cavity or overmolding process. In the embodiment shown in FIG. 1, a portion 322 of heat spreader structure 32 is optionally exposed or not covered by encapsulating layer 29 to further improve thermal dissipation. Alternatively and as shown in FIG. 9, encapsulating layer 29 covers heat spreader structure 32. In a further embodiment, an optional thermally conductive but electrically insulative layer 280 (e.g., thermal grease or the like) is formed over the top surface 28 of package 10. Layer 280 is shown as a partial layer in FIG. 1 because it is optional. It is understood that when used, layer 280 preferably covers the entire top surface 28.

In a preferred method for forming package 10 and after attachment structure 31 and heat spreader structure 32 are attached, formed or integrated, the assembly is placed in a molding apparatus so that portions 322 contact or adjoin a surface of the mold cavity. The surface of the mold cavity acts as a mask to prevent encapsulating material 29 from covering portions 322 of heat spreader structure 32. It is understood that this method is suitable for forming the other package embodiments having exposed heater spreader portions described herein.

In an exemplary embodiment, encapsulating layer 29 comprises a high thermal conductivity mold compound. Preferably, encapsulating layer 29 comprises a mold compound having a thermal conductivity greater than about 3.0 Watts/MK. Suitable high conductivity mold compounds are available from Sumitomo Plastics America of Santa Clara, Calif. (e.g., EME A700 series) and Hitachi Chemical of Santa Clara, Calif. (e.g., a CEL 9000 series mold compound).

Attachment structure 31 and heat spreader structure 32 are shown with one or more optional mold lock features or notches 39, which are used to provide better adhesion between encapsulating layer 29, attachment structure 31, and/or heat spreader structure 32. More or fewer notches 39 may be used. It is understood that notches 39 are optionally incorporated with any of the attachment/heat spreader structures described herein.

Figure 2:
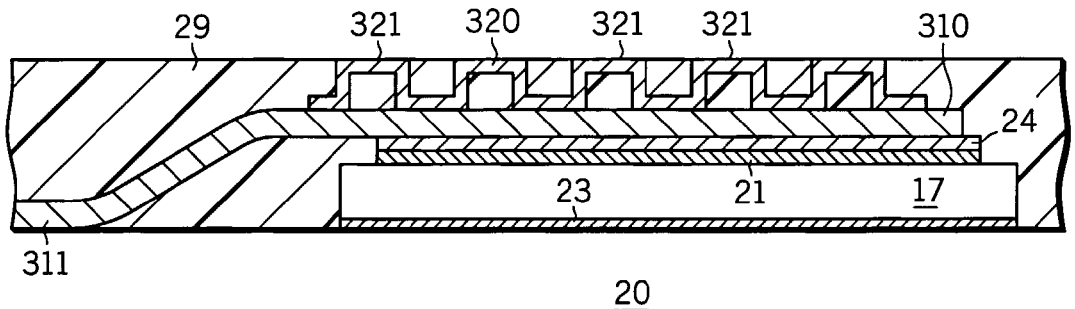
FIG. 2 illustrates an enlarged cross-sectional view of a package structure according to a second embodiment of the present invention.

FIG. 2 shows an enlarged cross-sectional view of a packaged semiconductor structure, leadless package, leadless packaged device, or package 20 according to a second embodiment of the present invention. Package 20 does not include lead frame 11, but instead electrode or terminal 23 of semiconductor chip 17 is exposed to directly couple to a next level of assembly. By eliminating lead frame 11, a thinner package profile is achieved. An attachment structure or conductive clip 310 is attached to source electrode 21 using attachment layer 24, and a distal end 311 of conductive clip 310 is shaped to also couple to a next level of assembly. In this embodiment, the heat spreader comprises a ribbon bond structure 320.

Ribbon bond structure 320 refers to a flexible rectangular shaped conductor having a width greater than its thickness. Suitable materials for ribbon bond structure 320 include gold, aluminum, silver, palladium, copper, or the like. Attachment of ribbon bond 320 to attachment structure 310 is achieved using, for example, wedge bonding. In one embodiment, ribbon bond structure 320 is formed having a thickness of about twenty five microns and a width of about seventy five microns. Alternatively, ribbon bond structure 320 is typically formed to a thickness of about six microns to fifty microns and a width of about fifty microns to fifteen hundred microns wide. In the embodiment shown, portion(s) 321 of ribbon bond structure 320 are exposed or not covered by encapsulating layer 29 to further enhance thermal dissipation. In an alternative embodiment, encapsulating layer 29 covers ribbon bond structure 320, but the distance between portions 321 and surface 28 are minimized to minimize thermal resistance.

Figure 3:
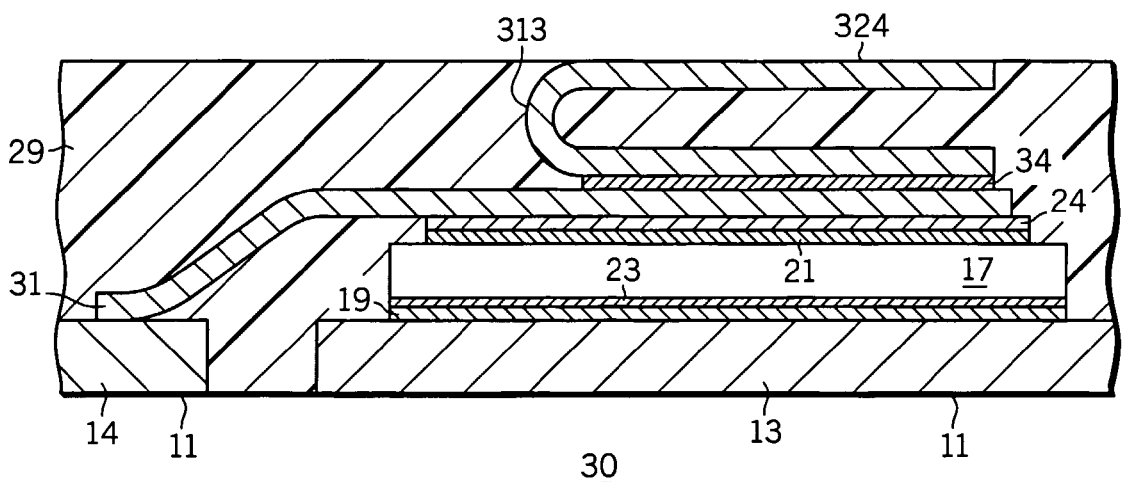
FIG. 3 illustrates an enlarged cross-sectional view of a package structure according to a third embodiment of the present invention.

FIG. 3 shows an enlarged cross-sectional view of a packaged semiconductor structure, leadless package, leadless packaged device, or package 30 according to a third embodiment of the present invention. Package 30 is similar to package 10 except that in package 30 a compliant or flexible heat spreader structure 313 is used. Heat spreader structure 313 comprises copper or a copper alloy and may be optionally plated with silver for either solder attachment or conductive epoxy attachment.

Heat spreader structure 313 is "u" or horseshoe shaped, and is spring-like, resilient or accommodating in structure so that it stays expanded or contracts under a compressive force to ensure a portion 324 is exposed after molding. For example, if flag 13, semiconductor chip 17, and/or clip 31 are on the lower end of the thickness tolerances, heat spreader structure 313 stays expanded to contact the mold surface during molding. If flag 13, semiconductor chip 17, and/or clip are on the upper end of the thickness tolerances, heat spreader structure 313 compresses during molding to accommodate for the thicker profile.

Figure 4:
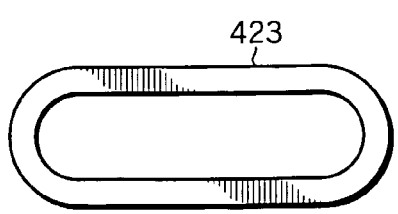
FIGS. 4-7 illustrate views of alternative heat spreader structures for use with the present invention.
Figure 5:
Figure 6:
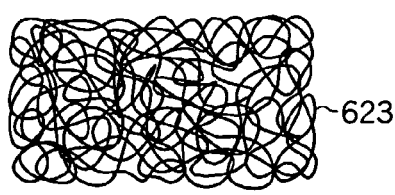

FIGS. 4, 5 and 6 show alternative embodiments for compliant or accommodating heat spreader structures. For example, FIG. 4 shows a side view of a compliant elliptical or oval shaped heat spreader or clip 423, and FIG. 5 shows a compliant spring-like circular, spring, coil-like or helical heat spreader structure 523. FIG. 6 shows a compliant sponge-like or scouring pad-like mesh or random matrix or mesh of thermally conductive material 623. In an exemplary embodiment, mesh 623 comprises a metal mesh (e.g., copper or the like). In an alternative embodiment, mesh 623 is placed between the attachment structures and other heat spreader structures described herein to provide further enhanced thermal dissipation. For example, mesh 623 is added between clip 131 and heat spreader 32 shown in FIG. 9 to provide a second heat spreader structure. Mesh 623 is shown in part in FIG. 9 because it is optional. It is understood that mesh 623 may alternatively substantially fill or partially fill the space between the attachment structure and the other heat spreader.

Figure 7:
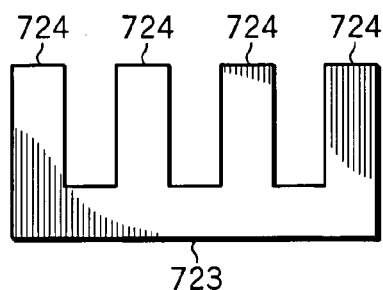

FIG. 7 shows a side view of a heat spreader structure 723 including one or more fin portions 724, which is suitable for the embodiments disclosed herein.

Figure 8A:
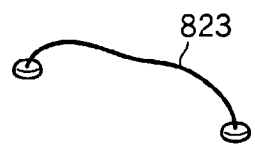
FIGS. 8a-b illustrate views of further heat spreader structures for use with the present invention.
Figure 8B:

FIGS. 8a and 8b show side views of wire bond structures suitable for bonding to the clips shown herein (e.g., clip 31) to provide further heat spreader structures. FIG. 8a shows a ball bond structure 823, which is formed on the attachment structure using conventional ball bonding techniques. FIG. 8b shows a wedge or stitch bond structure 825, which is formed on the attachment structure using conventional wedge bonding techniques. Heat spreaders 823 and 825 comprise for example, aluminum or the like.

FIG. 9 shows an enlarged cross-sectional view of a packaged semiconductor structure, leadless package, leadless packaged device, or package 40 according to a fourth embodiment of the present invention. Package 40 is similar to package 10 except that in package 40, an encapsulating layer 29 covers heat spreader structure 32 so that no portions of heat spreader structure 32 are exposed. Preferably, distance 86 between heat spreader 32 and top surface 28 is minimized to minimize thermal resistance. In an exemplary embodiment, distance 86 is less than about 0.13 millimeters (mm). Also, package 40 includes a flat or substantially planar attachment structure or clip 131, which is coupled on one end to electrode 21 of semiconductor chip 17, and coupled to a pad portion 141 on the other end. Additionally, in package 40, terminal 23 of semiconductor chip 17 is exposed as shown for attachment to a next level of assembly. As described above, package 40 is shown in with optional mesh 623, which functions as a second or additional heat spreader.

Figure 10:
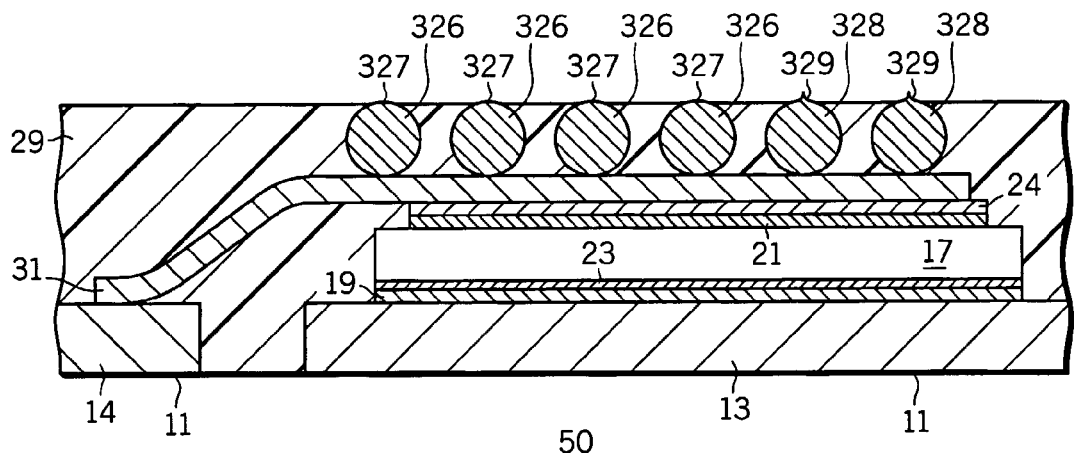
FIG. 10 illustrates an enlarged cross-sectional view of a package structure according to a fifth embodiment of the present invention.

FIG. 10 shows an enlarged cross-sectional view of a packaged semiconductor structure, leadless package, leadless packaged device, or package 50 according to a fifth embodiment of the present invention. Package 50 is similar to package 10 except that in package 50 the heat spreader structure comprises a plurality of conductive sphere like shapes or balls 326. In an exemplary embodiment, balls 326 are metal sphere shapes comprising copper, solder, gold, aluminum, metal coated ceramics, metal coated plastic, or the like, and are attached using for example, a solder or epoxy. Alternatively, sphere like shapes 328 are formed on clip 31 using a clipped wire bond approach and comprise aluminum or the like. Preferably, portions 327 or 329 of balls 326 or 328 are exposed through encapsulating layer 29 as shown to further enhance thermal dissipation. Alternatively, encapsulating layer 29 covers balls 326 with balls 326 remaining in proximity to the surface of package 50 to minimize thermal resistance.

Figure 11:
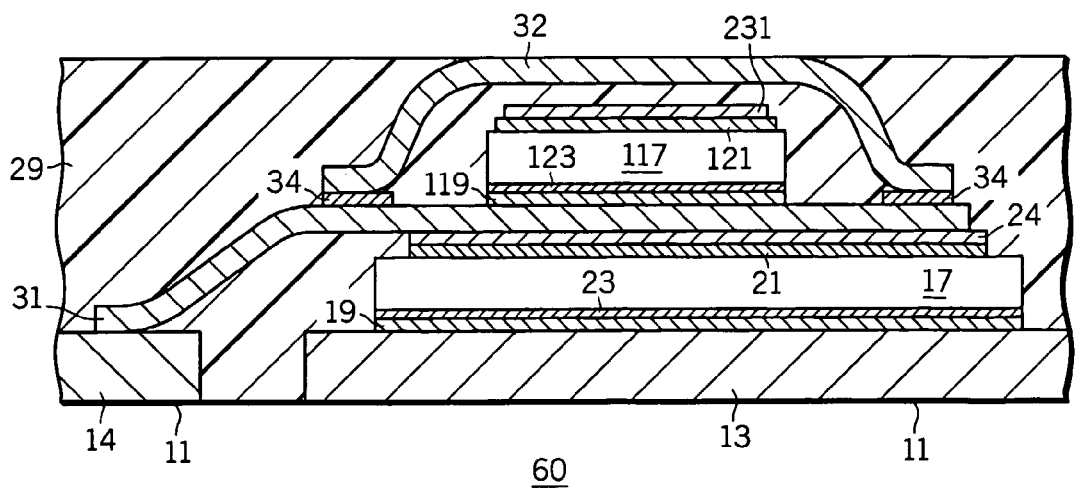
FIG. 11 illustrates an enlarged cross-sectional view of a package structure according to a another embodiment of the present invention.

FIG. 11 shows an enlarged cross-sectional view of a packaged semiconductor structure, leadless package, leadless packaged device, or package 60 according to another embodiment of the present invention. Package 60 is similar to package 10 except that package 60 further includes a second semiconductor chip or component 117. Second component 117 is the same as or different than semiconductor chip 17. In an exemplary embodiment when semiconductor chip 17 comprises a power MOSFET, second component 117 comprises a Schottky diode having a termination or electrode 123 coupled to clip 31. For example, termination 123 is coupled to clip 31 using an attachment layer 119. Termination 123 is electrically coupled to clip 31, or may be isolated from clip 31 with electrical contact to termination 123 achieved using a laminate structure (e.g., a conductive layer separated from clip 31 by an insulating layer). Another termination or electrode 121 is coupled to another pad portion (not shown) of package 60 using a second attachment structure or clip 231. In this embodiment, heat spreader structure 32 spans over second component 117 for example, to save space.

Figure 12:
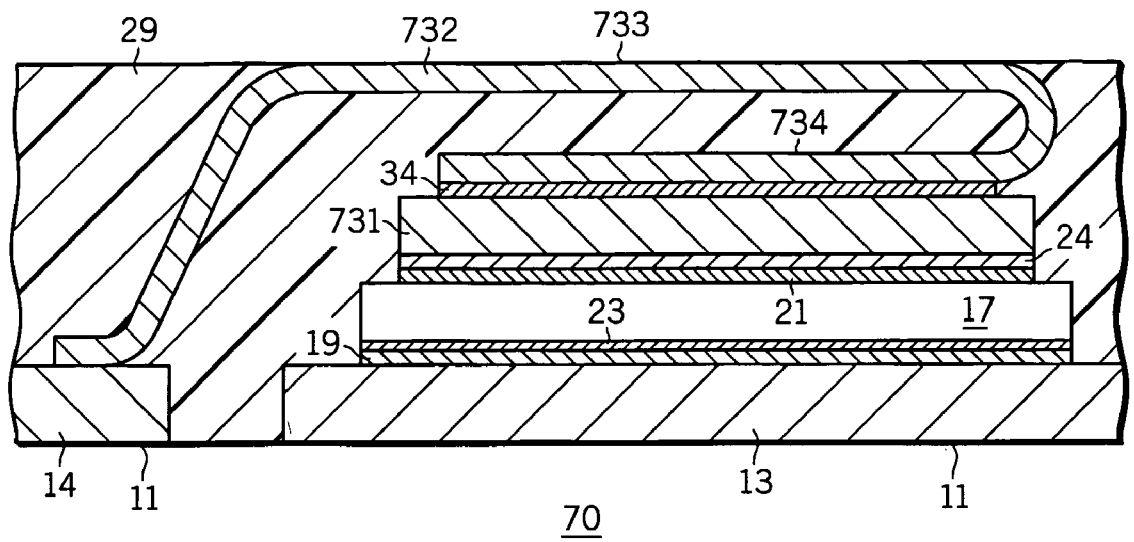
FIG. 12 illustrates an enlarged cross-sectional view of a package structure according to a further embodiment of the present invention.

FIG. 12 shows an enlarged cross-sectional view of a packaged semiconductor structure, leadless package, leadless packaged device, or package 70 according to a further embodiment of the present invention. Package 70 is similar to package 10 except that in package 70, attachment structure 732 acts as a heat spreader, and a conductive plate or disc 731 couples electrode 21 to attachment structure 732 using attachment layer 34 as described above. In an exemplary embodiment, plate 731 is designed to match the shape or outline of electrode 21 to provide an optimized heat and electrical current spreading capability. Plate 731 can match electrode 21 without the need to modify 732 thereby improving manufacturability. Optionally, plate 731 is formed on semiconductor chip 17 at wafer level to further improve manufacturability.

In the embodiment shown in FIG. 12, attachment structure 732 has a compliant or accommodating shape similar to heat spreader 313 shown in FIG. 3, which compensates for thickness tolerance variations of the various components. In an alternative embodiment, attachment structure 732 has a shape similar to attachment structure 31 or 310 (if lead frame 11 is eliminated). Attachment structure 732 and conductive plate 731 comprise materials similar to those described for attachment structure 31 and heat spreader 32. Attachment structure 732 includes an optional exposed portion 733. The length of coupling portion 734 of attachment structure 732 can be the same as or different than the width of conductive plate 731.

Figure 13:
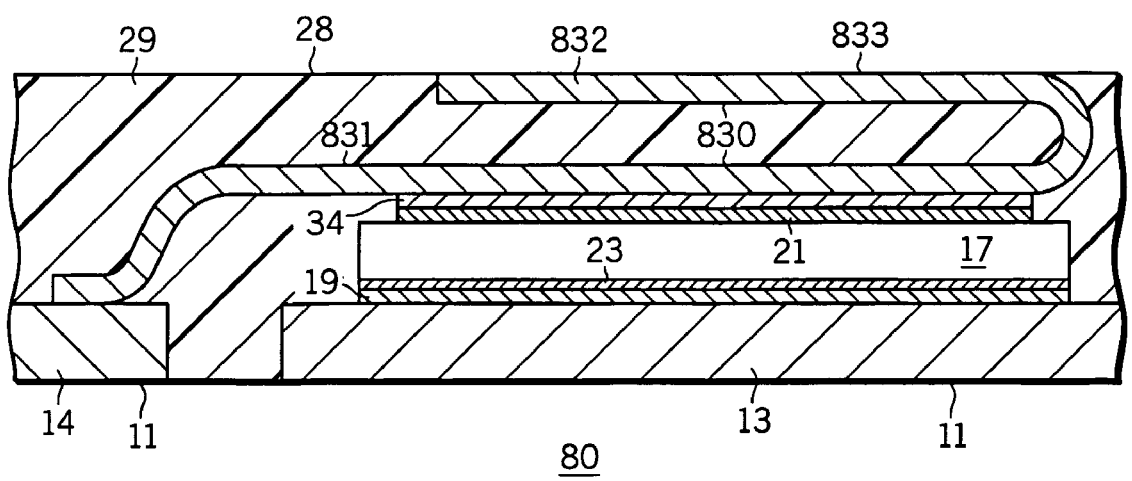
FIG. 13 illustrates an enlarged cross-sectional view of a package structure according to a still further embodiment of the present invention.

FIG. 13 shows an enlarged cross-sectional view of a packaged semiconductor structure, leadless package, leadless packaged device, or package 80 according to a still further embodiment of the present invention. Package 80 is similar to package 10 except that conductive structure 830 has an attachment portion or structure 831 and a heat spreader portion 832 coupled, integrated, or formed as or from a single piece of material. As shown in FIG. 13, heat spreader portion 832 extends away from semiconductor chip 17, and is adjacent or in proximity to surface 28 of package 80. In an exemplary embodiment, a portion 833 of heat spreader 832 is exposed. In an alternative embodiment, heat spreader 832 is covered. Preferably, conductive structure 830 has a compliant or accommodating shape, which compensates for thickness tolerance variations of the various components. Conductive structure 830 comprises materials similar to those described for attachment structure 31 or heat spreader 32. In a further embodiment, the shape of conductive structure 830 is inversed to be similar to the shape of attachment structure 732 shown in FIG. 12.

Figure 14A:
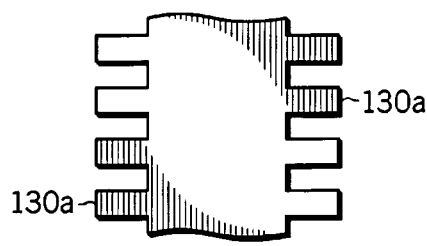
FIGS. 14a-d illustrate partial top views of portions of alternative heat spreaders in accordance with the present invention.
Figure 14B:
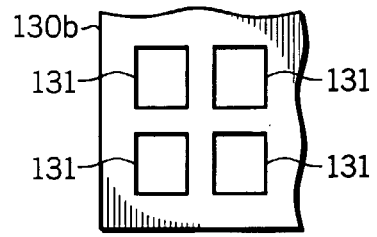
Figure 14C:
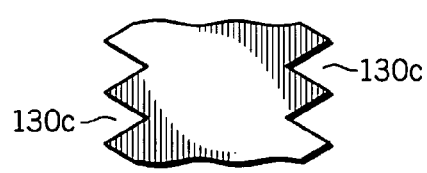
Figure 14D:
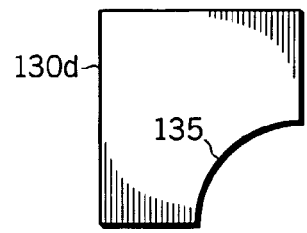

The heat spreaders shown herein may have a solid or continuous shape or form. FIGS. 14a-d show various partial top views for alternative shapes, portions or forms for heat spreaders 32, 313, 321, 423, 723, 732, and 832. These shapes provide, among other things, enhanced adhesion between encapsulating layer 29 and the heater spreader portion. FIG. 14a shows a comb-like or finned shape or portion 130a; FIG. 14b shows a shape or checker-board shape 130b including an opening(s) or hole(s) 131; FIG. 14c shows a saw-tooth shape or portion 130c; and FIG. 14d shows a heat spreader 130d having a "c" shaped cut-out portion 135.

In summary, there has been described a package structure that includes various embodiments of integrated attachment/heat spreader devices, which provide, among other things, enhanced thermal dissipation or heat transfer characteristics.

What is claimed is:

1. A semiconductor package having enhanced thermal dissipation comprising:
   a lead frame including a terminal portion;
   a first semiconductor device having a first electrode on a surface;
   a conductive clip having first and second opposed major surfaces, wherein the first major surface is coupled to the first electrode, and wherein the conductive clip is further coupled to the terminal portion;
   a second semiconductor device coupled to the second major surface of the conductive clip and overlying at least a portion of the first semiconductor device;
   a thermally conductive device coupled to the second major surface of the conductive clip and having a portion that spans to overlie at least a portion of the second semiconductor device; and
   an encapsulating layer covering the semiconductor package including at least a portion of the thermally conductive device.

2. The package of claim 1, wherein the first semiconductor device comprises a MOSFET.

3. The package of claim 1, wherein the second semiconductor device comprises a Schottky device.

4. The package of claim 1, wherein the encapsulating layer comprises a material having a thermal conductivity greater than or equal to about 3.0 Watts/mK.

5. The package of claim 1, wherein the package is configured as a leadless package.

* * * * *